United States Patent [19]

Kirkpatrick

[11] 4,151,008

[45] Apr. 24, 1979

[54] METHOD INVOLVING PULSED LIGHT PROCESSING OF SEMICONDUCTOR DEVICES

[75] Inventor: Allen R. Kirkpatrick, Lowell, Mass.

[73] Assignee: Spire Corporation, Bedford, Mass.

[21] Appl. No.: 780,416

[22] Filed: Mar. 23, 1977

Related U.S. Application Data

[60] Continuation-in-part of Ser. No. 636,055, Nov. 28, 1975, abandoned, which is a division of Ser. No. 524,062, Nov. 15, 1974, Pat. No. 3,950,187.

[51] Int. Cl.$^2$ .......................................... H01L 21/26
[52] U.S. Cl. .............................. 148/1.5; 219/121 L; 250/492 A; 357/91
[58] Field of Search .................... 148/1.5; 219/121 L; 250/492 A; 331/DIG. 1; 357/91

[56] References Cited

U.S. PATENT DOCUMENTS

| | | | |
|---|---|---|---|
| 3,420,719 | 1/1969 | Potts | 148/188 |
| 3,461,547 | 8/1969 | Di Curcio | 29/574 |
| 3,585,088 | 6/1971 | Schwuttke et al. | 148/174 |
| 3,940,289 | 2/1976 | Marqwardt et al. | 148/1.5 |
| 4,059,461 | 11/1977 | Fan et al. | 148/1.5 |

FOREIGN PATENT DOCUMENTS

| | | | |
|---|---|---|---|
| 1093822 | 12/1967 | United Kingdom | 148/1.5 CP |
| 1153282 | 5/1969 | United Kingdom | 219/121 L |

OTHER PUBLICATIONS

Kachurin et al., "Annealing . . . Defects by Laser . . . Pulses", Sov. Phys. Semicond. 9 (1976) 946.
Shtyrkov et al., "Local Laser Annealing . . . S/C Layers", Sov. Phys. Semicond. 9 (1976) 1309.
Antonenko et al., ". . . Implanted Impurity in Si . . . Laser Annealing", Sov. Phys. Semicond. 10 (1976) 81.
Kutukova et al., "Laser Annealing of . . . Si", Sov. Phys. Semicond. 10 (1976) 265.
Bolotov et al., "Laser Annealing . . . Ion-irradiated GaAs", Sov. Phys. Semicond. 10 (1976) 338.
Kachurin et al., "Annealing of Implanted Layers by . . . Laser . . . ", Sov. Phys. Semicond. 10 (1976) 1128.
Klimenko et al., ". . . Argon Laser . . . Ion-Implanted -Amorphised Si . . . ", Sov. J. Quant. Electron. 5 (1976) 1289.
Kistemaker (Report), Round Trip in the USSR, Sep. 1977.
M. L. Joshi, "Inducing Impurity Migration in Semiconductors by Lasers", IBM TDB, vol. 11, (1968) p. 104.
Y. Matsuoka et al., "Normal Laser Damage of Si Solar Cells . . . ", Appl. Phys. Lett. 25 (1974) 574.
R. J. Von Gutfeld, ". . . Crystallization . . . Optical Pulses on Te-Based Memory Materials", Appl. Phys. Lett. 22 (1973) 257.

*Primary Examiner*—L. Dewayne Rutledge
*Assistant Examiner*—Upendra Roy
*Attorney, Agent, or Firm*—Morse, Altman, Oates & Bello

[57] ABSTRACT

A pulsed laser or flash lamp produces a short duration pulse of light for thermal processing of selected regions of a semiconductor device. The light pulse is directed towards the semiconductor device and irradiates selected surface regions of the device to be processed. Energy deposited by the light pulse momentarily elevates the temperature of the selected regions above threshold processing temperatures for rapid, effective annealing, sintering or other thermal processing. The characteristics of the light pulse are such that only those surface vicinity regions to be processed are elevated to a high temperature and the remaining mass of the semiconductor device is not subjected to unnecessary or undesirable high temperature exposure.

5 Claims, 8 Drawing Figures

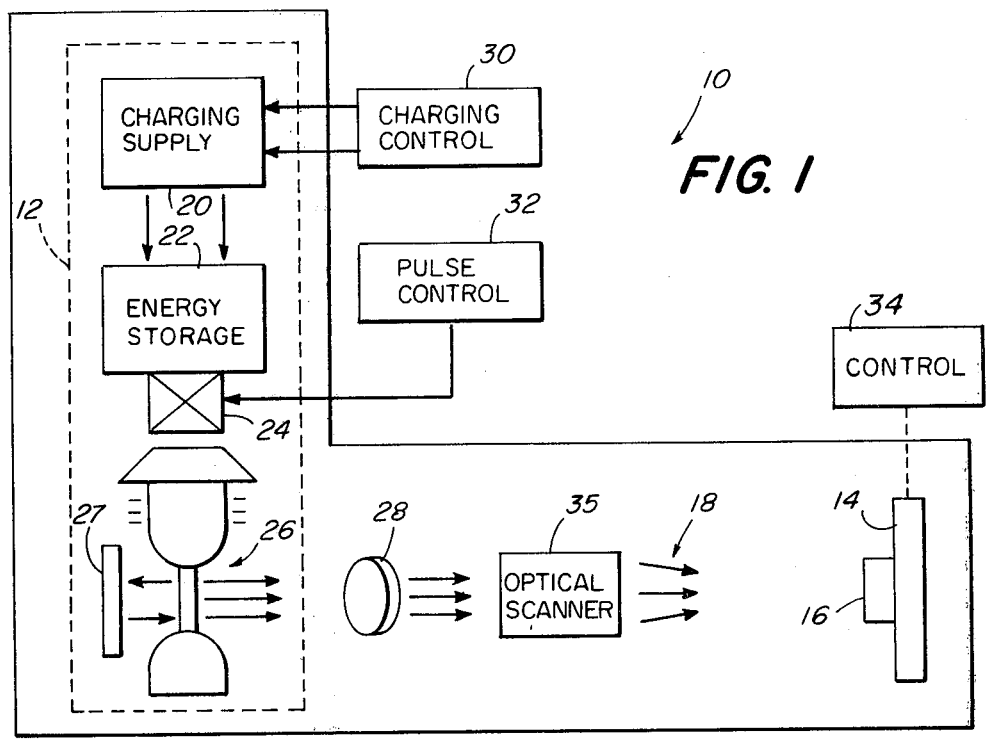
FIG. 1
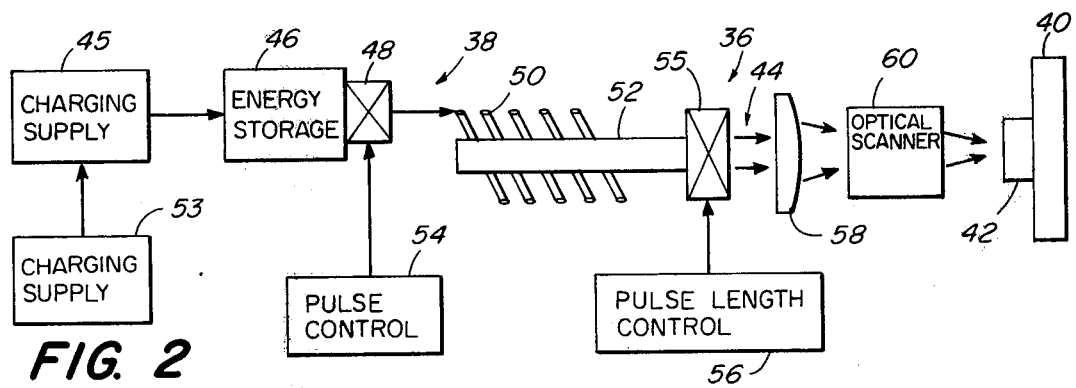
FIG. 2
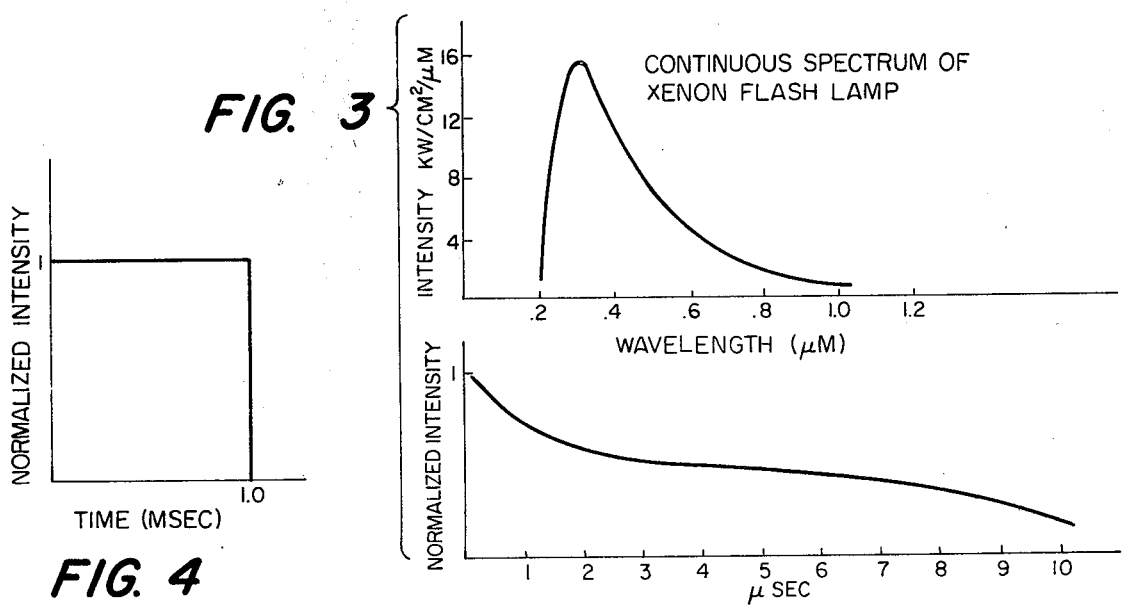
FIG. 3
FIG. 4

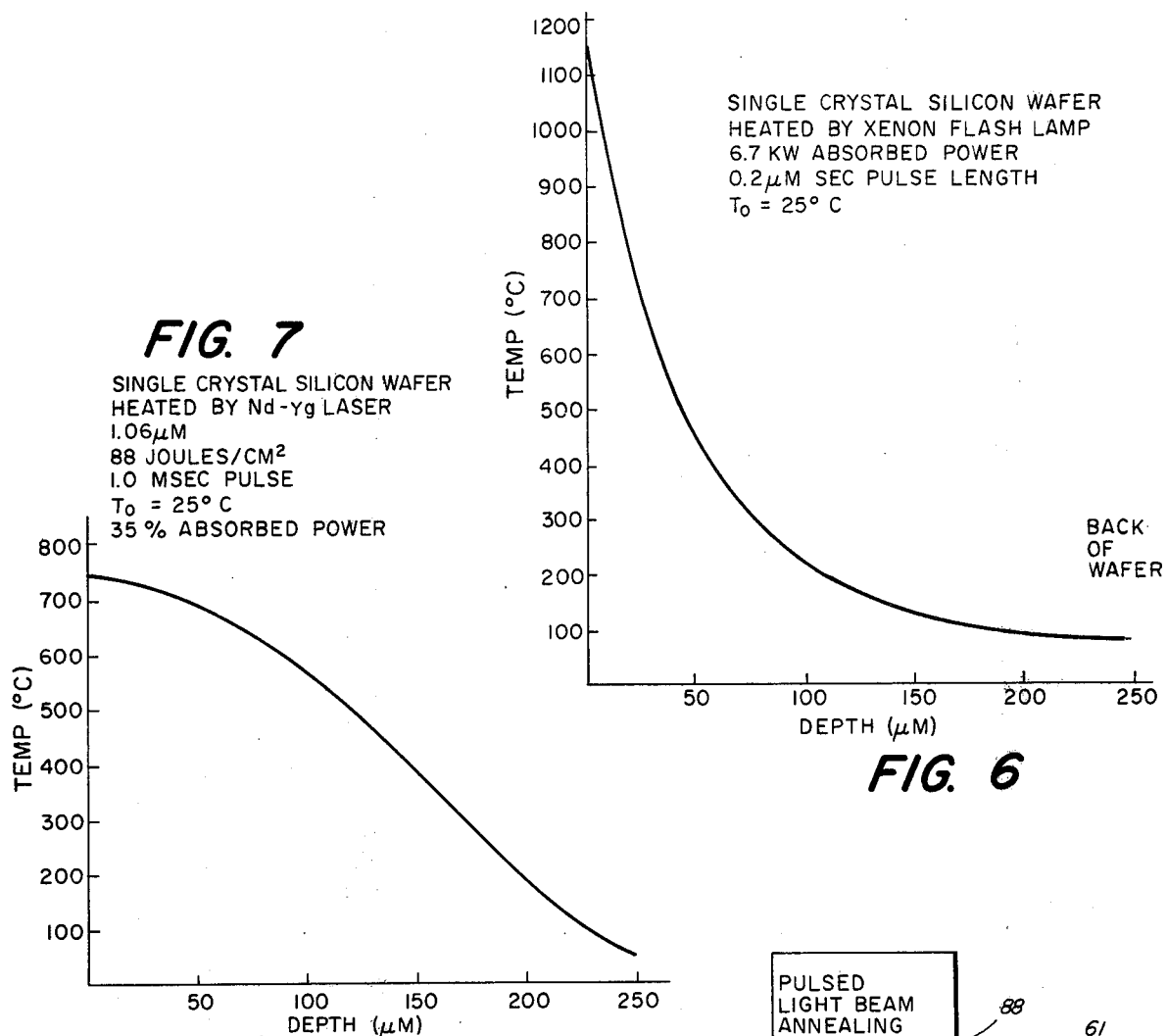
FIG. 7
SINGLE CRYSTAL SILICON WAFER
HEATED BY Nd-Yg LASER
1.06 μM
88 JOULES/CM²
1.0 MSEC PULSE
T₀ = 25° C
35 % ABSORBED POWER
FIG. 6
SINGLE CRYSTAL SILICON WAFER
HEATED BY XENON FLASH LAMP
6.7 KW ABSORBED POWER
0.2 μM SEC PULSE LENGTH
T₀ = 25° C
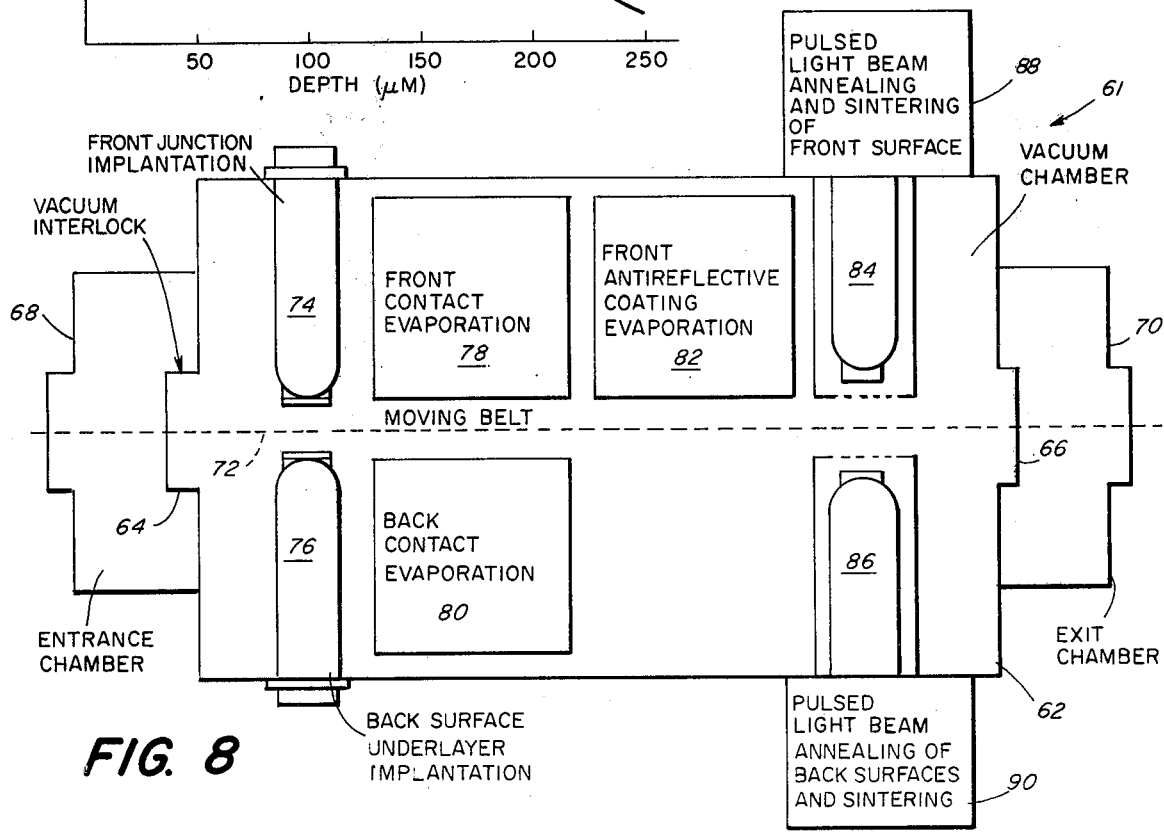
FIG. 8

METHOD INVOLVING PULSED LIGHT PROCESSING OF SEMICONDUCTOR DEVICES

CROSS-REFERENCE TO RELATED APPLICATIONS

This application is a continuation-in-part of Ser. No. 636,055, filed on Nov. 28, 1975, now abandoned which is a division of Ser. No. 524,062, filed on Nov. 15, 1974, now U.S. Pat. No. 3,950,187.

BACKGROUND OF THE INVENTION

1. Field of Invention:

The present invention relates to thermal processing of semiconductor devices and, more particularly, is directed towards a method and apparatus involving pulsed light beam localized thermal processing of semiconductor devices.

2. Description of the Prior Art:

Thermal processing has become a widely employed fabrication technique in the manufacture of semiconductor devices such as diodes, transistors, solar cells, integrated circuits and the like. Examples of commonly employed thermal processes include diffusion of dopant elements into semiconductor materials, annealing of crystalline structure after mechanical or radiation induced damage, annealing and electrical activation of dopant atoms after ion implantation, sintering of metallic and dielectric coatings to improve mechanical and optical properties.

Although it is desirable to influence only specific local regions of the device during individual processing steps, usually the regions in the vicinity of the surface, conventional thermal processing is performed by elevating the temperature of the entire device structure and by maintaining the temperature environment for an adequate period of time to produce the required thermal effects. Generally, thermal processing is performed in a furnace type facility for times ranging from a few minutes to several hours at temperatures less than 200° C. to temperatures above 1000° C. Such techniques, in addition to being time and energy consuming, have had limited application due to the fact that many materials and device structures degrade as a result of the thermal exposures necessary for the processes. A need exists for an improved method and apparatus for rapid thermal processing of specific regions of a semiconductor device that does not cause deleterious effects in the region being processed and that does not significantly alter other regions of the semiconductor material.

SUMMARY OF THE INVENTION

A pulsed laser beam or flash lamp produces a pulse of high intensity directed photons for thermal processing of a semiconductor device. The semiconductor device is positioned so that the selected regions of the device surface are exposed to the light pulse. The selected regions to be processed lie approximately within the light characteristic absorption depth of the surface. In certain cases, the device surface includes additional metal, insulator or semiconductor films or areas as required for the device structure. The light pulse momentarily elevates the temperature of the region being processed above a threshold temperature at which the desired effect occurs. Upon completion of the pulse and achievement of the desired temperature, the temperature profile relaxes back to an equilibrium level with a time constant that is related to geometry and material characteristics. The energy density of the light pulse is sufficiently high to elevate the temperature without causing deleterious effects such as melting, vaporization, fracturing, and the like. The duration of the light pulse is sufficiently short so that substantial temperature elevation occurs only in the vicinity of the surface region of the semiconductor device and other deeper regions or masked areas of the semiconductor device are not subjected to undesirable or unnecessary high temperature exposure.

An object of the present invention is to provide a method and apparatus involving pulsed light thermal processing of specific regions of a semiconductor device or material without subjecting other regions of the semiconductor device or material to excessive thermal exposure.

Another object of the present invention is to provide a method and apparatus involving pulsed light processing of a semiconductor device or material in which the temperatures of the specific regions being processed are momentarily elevated above a threshold temperature at which the required process effect takes place during the period of temperature elevation.

A further object of the invention is to provide a method and apparatus involving pulsed light annealing for restoring structural and electrical parameters of a semiconductor material that has been subjected to radiation damage as a result of ion implantation of dopant impurities. Annealing is completed in a sufficiently short period of time so that the carefully controlled and steep dopant gradient profiles, which are achieved by ion implantation, are not altered by atomic migrations due to thermal diffusion.

A still further object of the present invention is to provide a method and apparatus for annealing surface damage effects and for thermal sintering activation and optimization of mechanical, electrical and optical properties of surface conductive and insulating films such as electrical contacts, insulating layers, antireflective coatings, and the like, without allowing thermal diffusion of these materials and their components to occur below the surface region of the semiconductor device.

Still another and a further object of the present invention is to provide a method and apparatus involving pulsed light processing for thermal fabrication processes on semiconductor devices using much reduced total energy expenditure relative to that necessary for conducting present thermal process operations.

Other objects of the present invention will be in part obvious and will in part appear hereinafter.

The invention accordingly comprises the methods and apparatuses, together with their parts, steps, elements and interrelationships that are exemplified in the following disclosure, the scope of which will be indicated in the appended claims.

BRIEF DESCRIPTION OF THE DRAWINGS

A fuller understanding of the nature and objects of the present invention will become apparent upon consideration of the following detailed description taken in connection with the accompanying drawings, wherein:

FIG. 1 is a schematic and block diagram of a system embodying the present invention for pulsed flash lamp processing of semiconductor devices;

FIG. 2 is a schematic and block diagram of an alternate embodiment for pulsed laser processing of semiconductor devices;

FIG. 3 is a graphical representation of photon spectrum and intensity versus time characteristics of an ultra-violet flash lamp pulse for use in ion implantation damage annealing;

FIG. 4 is a graphical representation of the intensity versus time of a neodymium yag laser pulse for use in ion implantation damage annealing;

FIG. 6 is a graphical representation of the temperature profile in silicon for the ultraviolet flash lamp conditions of FIG. 3;

FIG. 7 is a graphical representation of the temperature profile in silicon for the neodynium yag conditions of FIG. 4; and FIG. 8 is a schematic and block diagram of the system embodying the present invention for ion implantation and pulsed light processing of semiconductor devices.

DETAILED DESCRIPTION OF THE PREFERRED EMBODIMENTS

Figure 5:
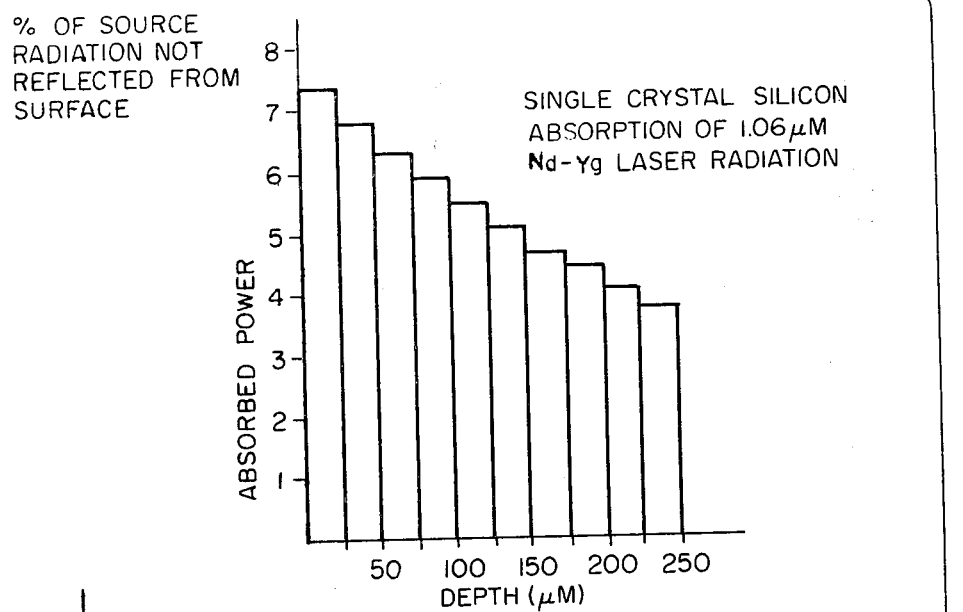
FIG. 5 is a graphical representation of energy deposited versus depth profiles in silicon for the light pulse conditions of FIG. 4 and 3.
Figure 5:
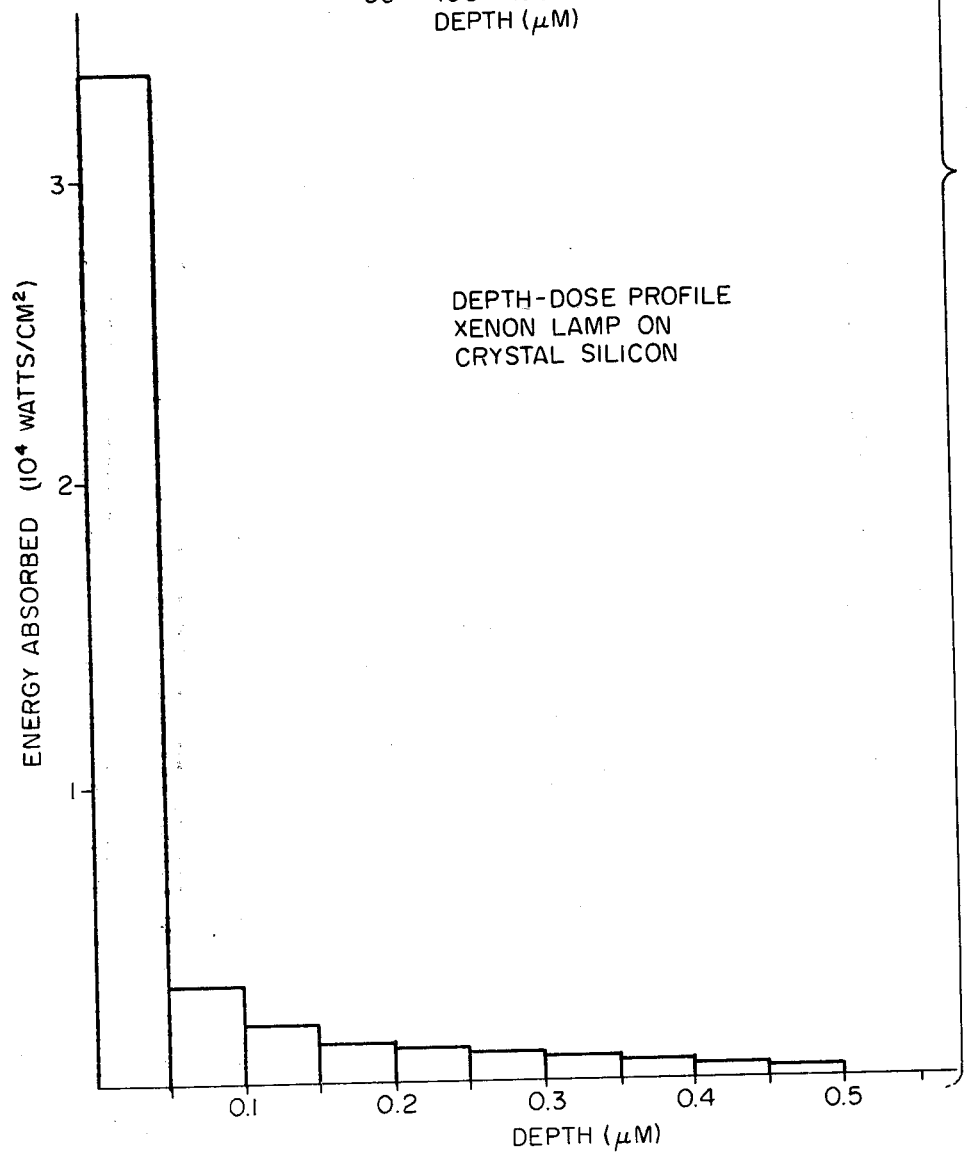

The present invention provides a method for localized thermal processing of specific regions of a semiconductor device or material by momentarily elevating the temperature of the semiconductor region. Thermal processing includes mechanical annealing, annealing and electrical activation of ion implanted material, annealing of radiation damage, sintering for electrical mechanical and optical characteristic improvement, short range atomic diffusion in the semiconductor, and the like. A short duration light pulse generated by a laser or flash lamp is directed towards specific semiconductor regions to be processed. The short duration pulse impacting upon the semiconductor device, which may include surface coatings, components, and the like, momentarily elevates the temperature in the vicinity of the impacted region. The pulsed photons incident upon the surface are absorbed as they penetrate the material. The desired thermal effect occurs when the temperature in the region to be processed exceeds a specified temperature threshold level, the temperature threshold level being related to the particular process effect desired and the semiconductor device material or materials involved.

The parameters that are available in the pulsed light processing are: (1) the energy spectrum of the pulsed light beam; (2) the duration of the light pulses; (3) the total energy per unit area carried to the semiconductor device surface by the photons per pulse; and (4) the total number of pulses employed. The photon energy spectrum, intensity and pulse width are selected so that the entire region to be processed is raised above its minimum process effect temperature without causing melting or fracturing at any position. Duration of the pulse is sufficiently short so that the deposited energy is not dissipated from the process region during the pulse period, whereby minimum processing temperatures are not presented throughout the region. The total energy deposited per unit area on the semiconductor device by the pulse is determined from consideration of the requirements for achieving minimum processing temperatures throughout the implanted region without exceeding thresholds for energy-induced structural damage mechanisms such as vaporization, melting, fracturing, and the like, anywhere in the semiconductor material. It has been found that single pulses are adequate for annealing particular ion implantation conditions in specific semiconductor materials, however, multiple pulses are necessary for completion of other pulsed processes under certain conditions.

Pulsed photons incident upon a material surface are absorbed as they penetrate the material. The energy of the photons is converted to heat in the absorbing material, the heating effect being spatially dependent upon rate and position at which the energy is absorbed. The momentary temperature elevation in a region extending from the material surface through an arbitrary selected depth is controlled by varying the pulsed light parameters. The use of the pulsed light for processing of semiconductor devices provides localization of thermal treatment at the necessary region, the treatment being performed in time durations of the order of $10^{-1}$ second or less. Temperatures achieved depend upon the material and the deposited energy density, and are controlled by selection of the characteristics of the light pulse. At completion of the light pulse and the achievement of peak temperature, the temperature profile relaxes back to an equilibrium level with a time constant which depends upon geometry and material characteristics.

Referring now to the drawings, particularly FIG. 1, there is shown a system 10 for thermal processing of semiconductor materials having an electrical conductivity in the approximate range of $10^4$ to $10^{-7}$ ohm$^{-1}$ cm$^{-1}$, for example semiconductor materials such as silicon, germanium, gallium arsenide, gallium phosphide, indium phosphide, cadmium telluride, aluminum antimonide, cadmium sulphide, copper oxide and the like. System 10 comprises a pulsed light source 12 and a platform 14 on which there is mounted a semiconductor device 16. Light source 12, for example a flash tube, generates a short duration pulse 18 that is directed towards semiconductor device 16 for localized thermal processing of specific regions of the semiconductor device, for example, the surface regions. Light source 12 includes a charging supply 20, an energy storage unit 22, an output switch 24, a high pressure discharge tube 26, a reflector 27, such as a mirror, and light focusing optics 28. Charging supply 20 is connected to a charging control 30 which controls the energy spectrum and light intensity. A pulse control 32, which is connected to switch 24, triggers an electrical pulse that is discharged through the tube 26. Focusing optics 28 direct the light to semiconductor device platform 14. Pulse duration is regulated by internal configuration of energy storage unit 22 and flash tube geometry and gas pressure. Energy density at the surface of the semiconductor device 16 is controlled by the focusing optics 28 and semiconductor device 16. Semiconductor device 16 is carried by platform 14, for example an XY table, that is movable by means of a controller 34 for proper alignment of semiconductor device 16 with respect to light beam 18. Semiconductor device 16 is positioned so that light beam 18 irradiates the surface being processed. In alternative embodiments, light beam 18 is scanned over the surface of semiconductor device 16 with an optical scanning apparatus 35 rather than positioning the semiconductor device by means of platform 14. The distance between optics 28 and the surface of semiconductor device 16 is in the approximate range of 0 to 1 meter depending upon focal length. By way of example, the approximate ranges of light pulse parameters are:

Pulse Duration—$10^{-9} - 10^{-1}$ second
Photon Energy—0.1 – 10 ev
Light Intensity—$10^{-3} - 10^3$ cal/cm$^2$ The impacting light pulse momentarily elevates the temperature of the semiconductor device surface in the region to be processed without subjecting the other portions of the semiconductor device to undesirable and unwanted thermal exposure.

In the alternative embodiment of FIG. 2, there is shown a system 36 for thermal processing of semiconductor material having an electrical conductivity in the approximate range of $10^4$ to $10^{-7}$ ohm$^{-1}$ cm$^{-1}$, for example semiconductor materials such as silicon, germanium, gallium arsenide, gallium phosphide, indium phosphide, cadmium telluride, aluminum antimonide, cadmium sulphide, copper oxide and the like. System 36 comprises a pulsed light source 38 and a platform 40 on which there is mounted a semiconductor device 42. Light source 38 generates a short duration noncoherent pulse 44 that is directed towards semiconductor device 42 for localized thermal processing of specific regions of the semiconductor device, for example, the surface regions. Light source 38 includes a charging supply 45, an energy storage unit 46, an output switch 48, a flash lamp 50 and a laser assembly 52. Charging supply 45 is controlled by a charging control 53. Output switch 48 and a pulse control 54 energize flash lamp 50, whereby laser assembly 52 emits pulsed light beam 44. The pulse length of light beam 44 is determined by a Q-switch 55 and a controller 56. The generated light beam is focused by optics 58 and a scanner 60 onto semiconductor device 42 in the manner described in connection with system 10. The approximate ranges of the parameters for light beam 44 are:

Pulse Duration—$10^{-9} - 10^{-1}$ second
Photon Energy—0.1 — 6 ev
Light Intensity—$10^{-3} - 10^3$ cal/cm$^2$ The pulsed light processing of systems 10 and 36 provides extremely rapid thermal processing of the semiconductor material, high temperatures being maintained in the processed region for time periods as short as microseconds or milliseconds until thermal relaxation has occurred after completion of the pulse. In consequence of the high temperatures being produced in only a limited region for only a short period of time, higher peak temperature utilization is more efficient than in conventional thermal processing techniques. In consequence, better effects are achieved.

Several examples of potential applications for the thermal processing techniques herein described includes: (1) electrical activation of dopant ions and annealing of radiation damage following ion implantation processing; (2) annealing and activation of ion implanted region containing a highly mobile ion species such as lithium, which is driven away by conventional elevated temperature annealing; (3) annealing and activation of an ion implantated region sufficiently and rapidly so as to maintain steep atomic concentration gradients by minimizing thermally induced migration; (4) sintering or alloying of metal-semiconductor interfaces to improve electrical contact and/or mechanical adherence; (5) treatments of dielectric coatings to improve optical quality and mechanical adherence; (6) melting and subsequent recrystallization of thin films of semiconductor materials to improve crystalline characteristics without altering the substrate of the films; (7) separation of individual devices from larger area wafers by pulsed induced fracture along prescribed boundaries; (8) the ability to produce local thermal treatment in regions of partially completed devices when the devices as a whole is not able to be subjected to the necessary thermal environment; and (9) processing of semiconductor devices from material to finished device including ion implanted junctions or regions, ohmic or barrier contacts, dielectric or metal coatings, and the like, with the material held at low temperature throughout processing except for local short duration pulsed thermal treatments in selected surface vicinity regions only.

The introduction of dopant ions into a semiconductor material by ion implantation causes radiation damage in the semiconductor structure and results in a necessity to anneal the implanted region for restoring crystal structure and for achieving high electrical conductivity. The major shortcoming of ion implantation for dopant impurity introduction is the radiation damage to the semiconductor material by the implant ions. The necessity to anneal at high temperatures, which approach diffusion temperatures, has been considered to partially offset the considerable advantages of ion implantation. Although it is possible to implant selected ions into any material at low temperature, the fact that many materials and structures are unable to withstand subsequent annealing without deterioration has prevented the use of ion implantation for many applications. Annealing conditions are usually selected in order to reduce the sheet resistance of the implanted layer to a minimum value.

Successful annealing of ion implantation damage in silicon has been accomplished with the use of pulsed laser and ultraviolet flash lamps. Tests have been performed with 5 through 50 keV phosphorous implant into P-type (111) single crystal silicon using implant fluences in the range of $1 \times 10^{14}$ to $1 \times 10^{16}$ ions cm$^{-2}$. In these tests, the depth of ion implant was considerably less than 1 $\mu$m. The effects on implanted layer sheet resistance due to single 0.1 $\mu$sec. electron pulses of 0.4 and 0.6 cal/cm$^2$ are comparable to the effects of conventional furnace annealing at temperatures up to 750° C. in a 97% nitrogen, 3% hydrogen atmosphere. A 0.1 cal/cm$^2$ neodymium yag laser pulse produced annealing approximately equivalent to that of furnace anneal at temperatures of 600 to 800° C. and a 0.3 cal/cm$^2$ ultraviolet flash lamp pulse also reduced sheet resistances significantly. Other tests have confirmed that pulsed light annealing of implanted layers reduces sheet resistance to values comparable to using furnace annealing. FIG. 3 is a graphical representation of the experimentally measured photon spectrum and intensity versus time characteristics of one of the 0.3 cal/cm$^2$ ultraviolet flash lamp pulses used in the test described above. FIG. 4 is a comparable graphical representation for the neodymium yag pulsed laser source. FIG. 5 is a graphical representation of the experimentally determined light pulse deposited energy as a function of depth from the silicon surface for the same ultraviolet flash lamp and laser pulse conditions described above. It will be seen that energy for the flash lamp only is deposited directly into approximately the first 0.5 $\mu$m of silicon below the surface. FIG. 6 shows computer calculations of temperature profiles in the silicon due to a 0.32 cal/cm$^2$ ultraviolet pulse immediately following completion of the particular pulses used. The ion implanted layer of depth less than 1 $\mu$m is predicted to have reached a maximum temperature exceeding 1100° C., the maximum temperature at a depth of 20 $\mu$m did not exceed 700° C. Further reduced maximum temperatures were experienced at greater depths. FIG. 7 shows computer calculations of temperature profiles in silicon due to the 20 cal/cm$^2$ neodymium yag pulse immediately following completion of the pulse. The ion implanted layer of depth less than 1 μm is predicted to have reached a maximum temperature exceeding 700° C. Reduced maximum temperatures were experienced at greater depths.

As hereinafter described, in conjunction with ion implantation of doping materials, device fabrication is entirely at low temperatures in the pulsed beam thermal processing. Pulsed processing, in conjunction with ion implantation, allows a wide range of devices to be processed entirely in a common vacuum environment or in atmosphere.

Referring now to FIG. 8, there is shown a system 61 for automated production of semiconductor devices, for example silicon solar cells. System 61 comprises a vacuum chamber 62 having input and output vacuum interlocks 64 and 66, an entrance chamber 68 and an exit chamber 70. Silicon wafers to be processed into solar cells are carried through vacuum chamber 62 on an endless moving belt 72. Ion implantation devices 74 and 76, which project into opposite sides of chamber 62 in registration with one another, are provided for front junction ion implantation and back surface underlayer implantation, respectively. Although not shown, it is to be understood that, for other ion species, additional implantation devices are provided. Vacuum evaporation stations 78, 80 and 82, which are disposed within chamber 62, are provided to deposit solar cell front and back contacts and front optical antireflective coatings. Other metal and insulating film sequences are used for different semiconductor devices. A pulsed light source 84, which projects into chamber 62, is operative to simultaneously pulse anneal the front surface ion implanted region, and pulse sinter the front metal contact film and front surface antireflective coating. A pulsed light source 86, which projects into chamber 62 in registration with source 84, is operative to simultaneously pulse anneal the solar cell back surface implanted layer and pulse sinter the back surface contact layer. Pulsed light sources 84 and 86, which are located at stations 88 and 90, respectively, are similar in structure and function to either pulsed light source 12 or 38. If, prior to processing, the silicon wafer is provided with diamond scribe lines to determine final surface dimensions, fracturing of the silicon along the scribed boundaries occurs during the pulsed light source processing at stations 88 and 90, and the completed cell is reduced to final dimensions.

In the above sequence, the silicon wafer is introduced into vacuum chamber 62 at room temperature and is heat sinked on endless belt 72. Heat sinking ensures that the silicon wafer is maintained at essentially room temperature throughout the processing cycle. If heat sinking of the wafer is not provided, a temperature rise in the range of a few degrees Centigrade to several hundred degrees Centigrade is experienced by the cell wafer due to total energy deposited by the individual processing operations, the implantations, evaporations and pulsed light processes.

Except for wafer preparation prior to insertion into the vacuum processing facility, no additional steps, such as etching, cleaning, masking, layer removal, and the like are necessary. In production, clean polished wafers on endless belt 72 enter vacuum chamber 62 through vacuum interlock 64. The wafers are carried by endless belt 72 to each of the processing devices within the chamber. The wafers emerge in minutes as finished solar cells ready for final test. No manual handling or control is involved. While ion implantation is included in the fabrication sequence, the key to being able to utilize implantation efficiently is the ability to effect annealing of implantation damage by pulsed energy deposition. In the neodymium yag laser example, for the implantation parameters used to produce a silicon solar cell, pulsed energy annealing is provided by depositing approximately 21 cal/cm$^2$ into only the first few microns of the implanted surface in a time frame of approximately 1.0 milliseconds.

Since certain changes may be made in the foregoing disclosure without departing from the scope of the invention herein involved, it is intended that all matter contained in the above description and shown in the accompanying drawings be construed in an illustrative and not in a limiting sense.

What is claimed is:

1. A method for localized thermal processing of a selected surface region of a semiconductor comprising the steps of:
    (a) generating short duration, noncoherent pulsed light;
    (b) directing said short duration pulsed light at the selected surface region of the semiconductor, said short duration, noncoherent pulsed light interacting with the selected surface region; and
    (c) momentarily elevating temperature only in a vicinity of the selected region by impacting said short duration, noncoherent light pulse upon the selected surface region.

2. The method as claimed in claim 1 wherein the pulse duration of said short duration, noncoherent pulsed light is in the range of $10^{-9}$ to $10^{-1}$ second.

3. The method as claimed in claim 1 wherein the thermal processing occurs in the semiconductor from the surface to a depth of approximately 3 microns.

4. The method as claimed in claim 1 wherein the energy of said noncoherent pulsed light is in the range of 0.1 to 6 eV.

5. The method as claimed in claim 2 wherein said pulse duration is approximately $10^{-3}$ second.

* * * * *